United States Patent [19]
Fett

[11] 3,953,746
[45] Apr. 27, 1976

[54] SELECTOR LATCH GATE

[75] Inventor: Darrell L. Fett, Scottsdale, Ariz.

[73] Assignee: Honeywell Information Systems, Inc., Waltham, Mass.

[22] Filed: July 29, 1974

[21] Appl. No.: 484,373

[52] U.S. Cl. .............. 307/247 R; 307/238; 307/291
[51] Int. Cl.² .................. H03K 17/60; H03K 3/286; G11C 15/04
[58] Field of Search ............ 307/223 R, 247 R, 238, 307/291

[56] References Cited
UNITED STATES PATENTS

| | | |
|---|---|---|
| 3,213,290 | 10/1965 | Klein et al. ..................... 307/223 R |
| 3,424,928 | 1/1969 | Priel et al. ........................ 307/247 R |
| 3,540,007 | 11/1970 | Hodges ............................ 307/238 |

Primary Examiner—John Zazworsky
Attorney, Agent, or Firm—W. W. Holloway, Jr.; E. W. Hughes

[57] ABSTRACT

A pair of cross-coupled transistors, a plurality of current switches and a current source provide the combined functions of data selection and data storage of data from a plurality of data input signals. Gating signals applied to the current switches determine which data signals are selected for storage in the gate.

2 Claims, 2 Drawing Figures

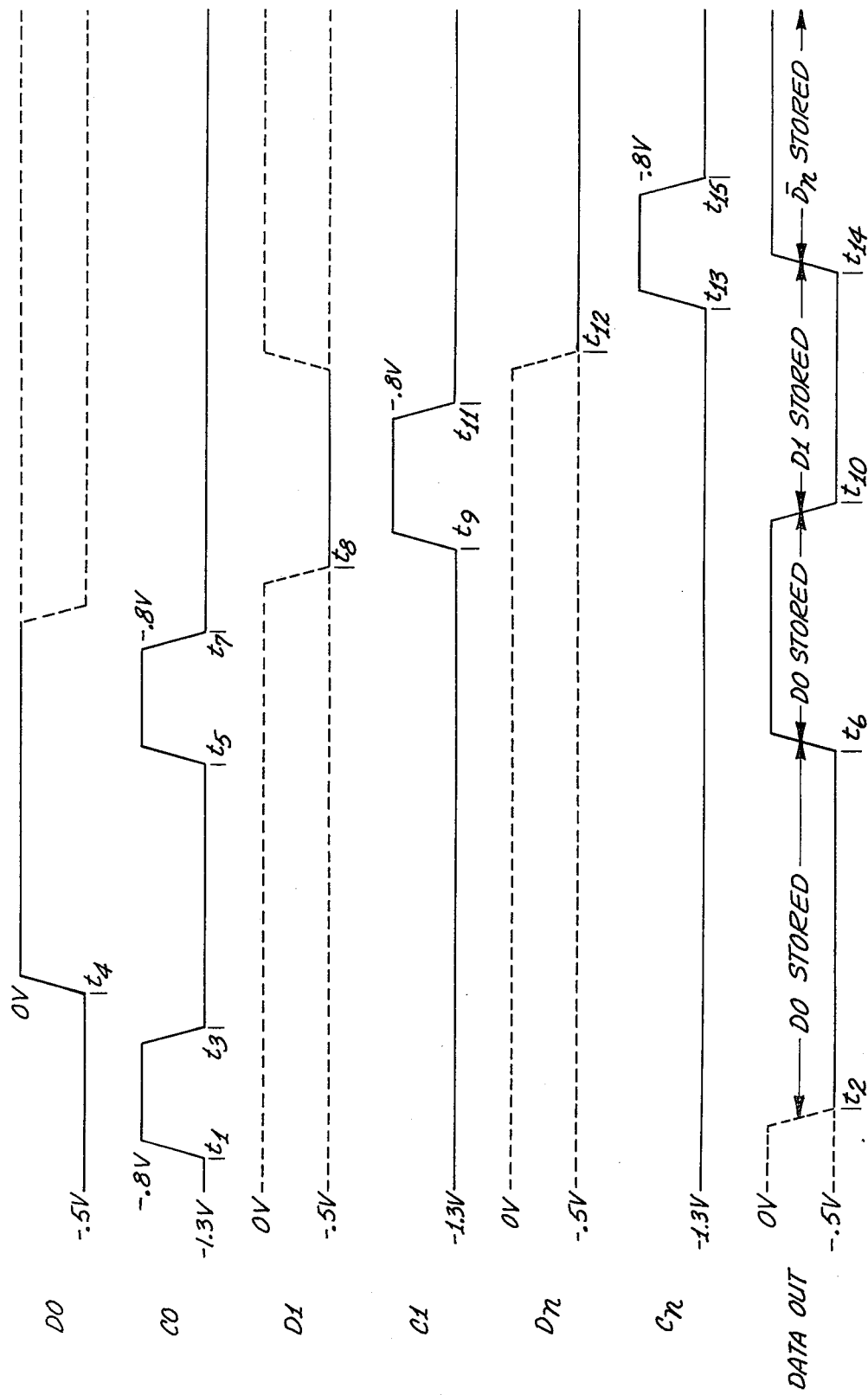

SELECTOR LATCH GATE

BACKGROUND OF THE INVENTION

This invention relates to data selection and data storage apparatus and more particularly to a simplified circuit which uses a pair of cross-coupled transistors, a plurality of current switches and a current source to select and store data from a plurality of data signals. Gating signals applied to the current switches determine which data signals are selected for storage in the apparatus.

Data selectors are used in high-speed data processing systems to control the flow of information to various portions of the processing system such as the storage registers. In prior art data processing systems a plurality of data selectors are connected to the storage registers so that data from a plurality of the data sources may be stored in the storage register. Each of the data selectors in the prior art system includes gates which are connected to the input leads of the storage register. The storage register includes a plurality of separate latches or flip-flops. The data selectors and the latches each use a separate current source and use separate controls each of which require gates, power and area on integrated circuit chips. The present invention alleviates the disadvantages of the prior art data selectors and storage registers by combining the functions of these selectors and registers into a single circuit. This combination reduces the power dissipation, reduces the number of gates required, reduces the area required on integrated circuit chips and decreases the cost.

It is, therefore, an object of this invention to provide a new and improved selector latch gate which incorporates the functions of both the data selector and the storage register.

Another advantage of this invention is to provide a selector latch gate having reduced power dissipation.

A further object of this invention is to provide a selector latch gate which develops both true and complementary output logic signals.

A further object of this invention is to provide a selector latch gate which stores the true or complement of data input signals.

SUMMARY OF THE INVENTION

The foregoing objects are achieved in the instant invention by providing a selector latch gate which provides the function of a data selector and a storage register. The selector latch gate also has means for providing both true and complementary output signals.

Other objects and advantages of this invention will become apparent from the following description when taken in connection with the accompanying drawings.

BRIEF DESCRIPTION OF THE DRAWINGS

FIG. 2 illustrates waveforms which are useful in explaining the operation of the invention shown in FIG. 1.

DESCRIPTION OF THE PREFERRED EMBODIMENT

Figure 1:
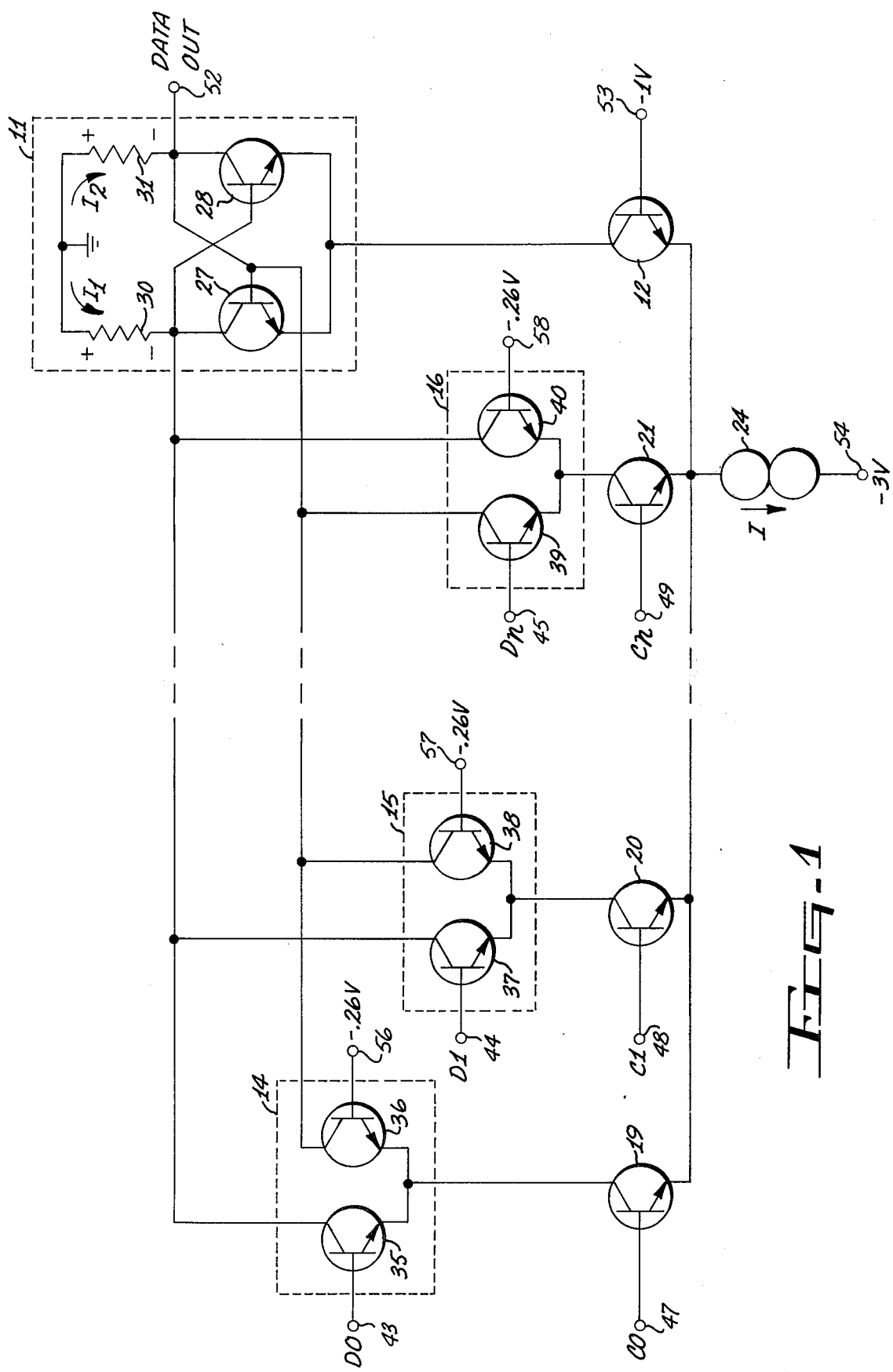
FIG. 1 is a circuit diagram of one embodiment of the present invention.

The selector latch gate shown in FIG. 1 includes a latching circuit means or storage latch 11 which stores the information coupled to the latch from the upper level current steering switches 14, 15, and 16. Data input signals are applied to the data terminals 43–45 and a clock or gating signal is applied to gating input terminals 47–49. The data output signal is coupled to data output terminal 52.

Storage latch 11 is a circuit which is locked or latched in either a "zero-state" or a "one-state" by the application of an input signal voltage and remains in that state until placed in the other state by another input signal voltage. The storage latch 11 is forced into a zero-state when a low or more negative value of voltage, representing a binary zero is applied to the base, or control terminal of transistor 27. This binary zero causes transistor 27 to be rendered nonconductive. When transistor 27 is nonconductive the current flow through resistor 30 one terminal of which is connected to current source 24 through ground and the other to the collector, or current in terminal, of transistor 27, is small so that there is only a small voltage drop across resistor 30 causing the voltage at the base, or control terminal of transistor 28 to be near ground potential. When the base, or control terminal of transistor 28 is near ground potential transistor 28 is rendered conductive so that a current flows through resistor 31 and transistor 28 since one terminal of resistor 31 is connected to current source 24 through ground and the other terminal of resistor 31 is connected to the collector, or current in terminal, of transistor 28 whose emitter, or current out terminal, is connected through transistor 12 to current source 24. The current through resistor 31 produces a voltage drop of the polarity shown across resistor 31 and causes the voltage at the base of transistor 27 to remain at a low value. This low value of voltage causes the latch 11 to be locked or latched in a zero-state until a higher or less negative value of signal is coupled to the base of transistor 27. When the latch is in a zero-state a low or negative value of voltage representing a binary zero is coupled to output terminal 52. A higher value of voltage applied to the base of transistor 27 causes the latch to be latched in a one-state and to provide a voltage near ground potential, representing a binary one, at the output terminal 52.

When a gating signal is applied to the CO or clock input terminal 47 of control transistor 19 of the lower level current steering switch which as illustrated is comprised of control transistors 19, 20, 21 and reference transistor 12 at the same time that a data signal is applied to the DO, or data input terminal 43 of upper level current steering switch 14 and to the control terminal, or base, of transistor 35 the data from the input terminal 43 is stored in the storage latch 11. Data applied to input terminal 44 is stored in the latch 11 when a gating signal is simultaneously applied to input terminal 48 of control transistor 20 of the lower level current steering switch. The complementary signal of the data applied to input terminal 45 is stored in latch 11 when a gating signal is simultaneously applied to the input terminal 49. A data signal from only one of the input terminals 43–45 can be stored in storage latch 11 at any given time. While only three upper level current steering switches 14–16 are shown, it should be understood that a greater or lesser number of current switches may be incorporated into the embodiment shown in FIG. 1.

When data from one of the data signal input terminals 43–45 is gated into latch 11 one of the gating signals on gating terminals 47–49 must be more positive than the voltage at the base, or control terminal, of reference transistor 12. When the voltages on terminals 47–49 are more negative than the reference voltage which has a value of −1 volt at the base, or control terminal of reference transistor 12 control transistors 19–21 are all rendered nonconductive and reference transistor 12 is rendered conductive. When reference transistor 12 is conductive and control transistors 19–21 are nonconductive the current $I_1$ or $I_2$ from latch 11 flows through collector, or current in terminal to emitter, or current out terminal, of reference transistor 12 and through current source 24 to terminal 54. When a binary one is stored in latch 11 a current $I_1$ flows from ground through resistor 30, from the collector, or current in terminal, to the emitter, or current out terminal, of transistor 27, from the collector to the emitter of transistor 12, through current source 24 to terminal 54. When a binary zero is stored in the storage latch 11 a current $I_2$ flows from ground through resistor 31, from the collector, or current in terminal to the emitter, or current out terminal of transistor 28, through transistor 12 and current source 24 to terminal 54. When current $I_1$ flows through resistor 30 there is no current through resistor 31 so the voltage at the output terminal 52, which is connected to the collector, or current in terminal, of transistor 28 is substantially at ground potential. When current $I_2$ flows through resistor 31 the voltage drop across resistor 31 causes the voltage at output terminal 52 to be more negative than the ground potential.

The operation of the preferred embodiment and the method of storing data therein will now be described in connection with the embodiment of FIG. 1 and the waveforms of FIG. 2. The dashed lines in the waveforms of FIG. 2 indicate that these signal voltages do not determine the type of signal stored in the storage latch 11. For example, prior to time $t_{12}$ the voltage Dn has no effect on the signal stored in latch 11 because the gating signal Cn on terminal 49 prevents Dn from being stored in the latch. This portion of the voltage waveform is often called the "don't care" voltage as the circuit designers are not concerned about this voltage or don't care what the voltage of $D_n$ is during this period of time.

Prior to the time $t_1$ of FIG. 2 the voltages on the input terminals 47–49 have a low value so that transistors 19–21 are nonconductive, transistor 12 is conductive and the current from latch 11 flows through transistor 12. It cannot be determined from the waveforms whether a binary one or a binary zero is stored in the storage latch 11.

At time $t_1$ the clock voltage CO increases to a value which is more positive than the −1 volt on the base of transistor 12. This causes transistor 19 to be rendered conductive. At this same time a low value of signal is applied to the signal input terminal 43 as shown in waveform DO. This low value of signal DO represents a binary zero. The signal voltage DO at the base or control terminal, of control transistor 35 is more negative than the reference voltage of −0.26 volts on the base, or control terminal, of reference transistor 36 so that control transistor 35 is nonconductive and reference transistor 36 is conductive. When transistor 36 is rendered conductive current flows from ground through resistor 31 in the storage latch 11, through collector to emitter the current in and current out terminals of transistor 36, from collector to emitter the current in and current out terminals of transistor 19, through current source 24 to terminal 54. The current through resistor 31 causes a voltage drop of the polarity shown across resistor 31 so that the voltage at the base of transistor 27 decreases thereby rendering transistor 27 nonconductive. When transistor 27 is rendered nonconductive there is no current through resistor 30 so the voltage at the base of transistor 28 is more positive than the voltage at the base of transistor 27.

When transistor 36 is rendered nonconductive at time $t_3$ the base, or control terminal, of transistor 28 is still more positive than the base, or control terminal, of transistor 27 so that transistor 28 in the storage latch is rendered conductive and current $I_2$ flows through resistor 31, through transistors 28 and 12 through current source 24 to terminal 54. Current $I_2$ through resistor 31 produces the voltage drop shown so that a low value of voltage is coupled to the data output terminal 52 thereby providing a binary zero at the output terminal 52. The junction between resistor 30 and the collector, or current input terminal, of transistor 27 will be at the one voltage level and can serve as a complementary data out terminal of latch means 11.

At time $t_4$ a more positive voltage representing a binary one is coupled to the DO input terminal 43. At time $t_5$ the voltage on the CO input terminal 47 increases to a −0.8 volts which is more positive than the voltage on the base of transistor 12. This causes transistor 19 to be rendered conductive. Since the voltage at the base of transistor 35 is more positive than the voltage at the base of transistor 36, transistor 35 is rendered conductive and transistor 36 is nonconductive. When transistors 35 and 19 are both rendered conductive current $I_1$ flows from ground through resistor 30, through transistors 35 and 19, and through current source 24 to terminal 54. Current $I_1$ produces a voltage drop of the polarity shown across resistor 30 so that the voltage at the base of transistor 28 is low thereby rendering transistor 28 nonconductive. When transistor 28 is nonconductive the voltage at the base of transistor 27 is substantially at ground potential so that transistor 27 will be rendered conductive at time $t_7$ when the transistor 19 is rendered nonconductive by the voltage CO on input terminal 47. This causes a binary one to be stored in the storage latch 11.

At time $t_9$ the clock voltage on the C1 input terminal 48 goes in a positive direction so that transistor 20 is rendered conductive and transistor 12 is rendered nonconductive. At this time the voltage on the base of transistor 37 is more negative than the voltage on the base of transistor 38 so that transistor 37 is rendered nonconductive and transistor 38 is rendered conductive. Current now flows from ground in the storage latch through resistor 31, through transistors 38 and 20, through the current source 24 to terminal 54. This current through resistor 31 produces a voltage drop of the polarity shown across the resistor 31 thereby providing a binary zero at the data output terminal 52. This low value of voltage on output terminal 52 also causes the base of transistor 27 to be relatively low so that transistor 27 is nonconductive and transistor 28 is conductive when the voltage on input terminal 48 decreases thereby rendering transistor 20 nonconductive at time $t_{11}$. When transistor 20 is nonconductive transistor 12 is again rendered conductive.

At time $t_{13}$ the voltage Cn applied to input terminal 49 increases so that transistor 21 is rendered conductive. At this same time the voltage Dn on input terminal 45 is low so that control transistor 39 is nonconductive and the voltage on the base, or control terminal, of reference transistor 40 renders transistor 40 conductive. When transistor 40 is conductive a current $I_1$ now flows from ground through resistor 30, through transistors 40 and 21 and through current source 24 to terminal 54. This current through resistor 30 causes a binary one to be stored in the storage latch 11. Thus, when a signal is applied to the input terminal 45 of the selector 16 the complementary signal is stored in the storage latch 11.

While the principles of the invention have now been made clear in an illustrative embodiment, there will be many obvious modifications of the structure, proportions, materials and components without departing from those principles. The appended claims are intended to cover any such modifications.

I claim:

1. A current steering selector latch gate for use with a source of data signals, a source of gating signals and a current source, said gate comprising:
    latching circuit means having a current in terminal, a current out terminal, a data out terminal, and a complementary data out terminal;
    $n$ upper level current steering switches, where $n$ is an integer greater than one, each switch having first and second current in terminals, a data input terminal, a reference voltage terminal, and a current out terminal;
    a lower level current steering switch having a reference voltage terminal, $n$ gate input terminals, $n + 1$ current in terminals, and a current out terminal;
    the first current in terminal of each of the upper level current steering switches connected to a data out terminal of the latching circuit, the second current in terminal of each of the upper level current steering switches connected to the other data out terminal of the latching circuit;
    the current out terminals of the upper level current steering switches connected respectively to $n$ current in terminals of the lower level current steering switch, the current out terminal of the latching circuit connected to the $n + 1$ current in terminal of the lower level current steering switch;
    the current out terminal of the lower level current steering switch and the current in terminal of the latching circuit adapted to be connected to the current source so that electrical current can flow through the current steering selector latch gate; and
    the reference voltage terminals of the upper and lower level current steering switches adapted to be connected to a source of reference voltages, each data input terminal of the upper current steering switches adapted to be connected to the source of data signals and each gate input terminal of the lower level current steering switch adapted to be connected to a source of gating signals.

2. A current steering selector latch gate for use with a source of data signals, a source of gating signals and a current source, said gate comprising:
    a storage latch comprising first and second transistors, each transistor having a current in terminal, a control terminal and a current out terminal; first and second resistors, each resistor having first and second terminals, the first terminals of the first and second resistors adapted to be connected to the current source; circuit means for cross connecting the current in terminals with the control terminals of the two transistors of the latch, the second terminal of the first resistor being connected to the current in terminal of the first transistor and the second terminal of the second resistor being connected to the current in terminal of the second transistor;
    a data out terminal connected to the current in terminal of the second transistor;
    $n$ upper level current steering switches where $n$ is an integer greater than one, each of the uppper level current steering switches comprising a control transistor and a reference transistor, each transistor having a current in terminal, a control terminal and a current out terminal, the control terminal of each reference transistor adapted to be connected to a source of reference potential and the control terminal of each control transistor adapted to be connected to a source of data signals; the current in terminal of the control transistor of each upper level current steering switch connected to a current in terminal of one of the transistors of the storage latch and the current in terminal of the reference transistor of each upper level current steering switch connected to the current in terminal of the other transistor of the storage latch;
    a lower level current steering switch comprising a reference and $n$ control transistors each transistor having a current in terminal, a control terminal and a current out terminal, the current in terminal of the reference transistor of the lower level current steering switch connected to the current out terminals of the transistors of said latch, the current in terminal of each control transistor of the lower level current steering switch connected respectively to the current out terminals of the transistors of its corresponding upper level current steering switch, the control terminal of the reference transistor adapted to be connected to a source of reference potential, the control terminal of each control transistor of the lower level current switch adapted to be connected to a source of gating signals, the current out terminals of the transistors of the lower level current steering switch adapted to be connected to the current source;
    the state of the latch corresponding to the data signal applied to the control terminal of the control transistor of an upper level current steering switch if the current in terminal of the control transistor of said switch is connected to the current in terminal of the first transistor of the storage latch if a gating signal is applied to the control terminal of the control transistor of the lower level current steering switch whose current in terminal is connected to the current out terminals of the transistors of said upper level current steering switch; and to the complement of the data signal applied to the control terminal of the control transistor of said upper level current steering switch if the current in terminal of the control transistor of said switch is connected to the current in terminal of the second transistor of the storage latch.

* * * * *